(12) United States Patent
Heavlin

(10) Patent No.: US 7,069,196 B1
(45) Date of Patent: Jun. 27, 2006

(54) EXPERIMENTAL DESIGN FOR COMPLEX SYSTEMS

(75) Inventor: William D. Heavlin, El Granada, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 596 days.

(21) Appl. No.: 09/808,786

(22) Filed: Mar. 15, 2001

(51) Int. Cl.
  *G06F 17/10* (2006.01)
  *G05B 13/02* (2006.01)
(52) U.S. Cl. .............................. 703/2; 700/30; 700/31; 700/32; 700/121; 716/20
(58) Field of Classification Search ................ 700/103, 700/121, 97, 28–32; 703/2, 13, 14; 716/4, 716/5, 19, 20; 702/84
See application file for complete search history.

(56) References Cited

U.S. PATENT DOCUMENTS

| | | | | |
|---|---|---|---|---|
| 5,646,870 A | * | 7/1997 | Krivokapic et al. | 716/4 |
| 5,655,110 A | * | 8/1997 | Krivokapic et al. | 716/19 |
| 5,724,251 A | * | 3/1998 | Heavlin | 716/5 |
| 5,966,527 A | * | 10/1999 | Krivokapic et al. | 703/14 |
| 6,304,836 B1 | * | 10/2001 | Krivokapic et al. | 703/14 |
| 6,366,822 B1 | * | 4/2002 | Heavlin | 700/31 |
| 6,389,366 B1 | * | 5/2002 | Heavlin | 702/84 |
| 6,567,717 B1 | * | 5/2003 | Krivokapic et al. | 700/121 |
| 6,708,073 B1 | * | 3/2004 | Heavlin | 700/121 |

OTHER PUBLICATIONS

Sacks et al ("design and Analysis of Computer Experiments", Statistical Science, 1989).*
Heavlin et al ("Dual Space Algorithms for Designing Space-Filling Experiments", 1994).*
Heavlin et al ("Columnwise Construction of Response Surface Designs", Advanced Micro Devices, 1998).*
Wynn ("The Sequential Generation of D-optimum Experimental Designs", 1970).*
Schank et al (An Introduction to Microelectronics Manufacturing and Markets, University of California, Berkeley, 1993).*
Krivokapic et al., Z Intrafield Effects and Device Manufacturability: A Statistical Simulation Approach, IEEE. #rd International Workshop on Statistical Metrology, Jun. 1998, pp. 36-39.*
Heavlin, W.D. First Silicon Experiments Within Wafers, 1999 IEEE International Symposium on Semiconductor Manufacturing, Oct. 1999, pp. 375-378.*
Yun et al., I. Parametric Manufacturing Yield Modeling og GaAs/AlGaAs Multiple Quantum Well Avalanche Photodiodes, IEEE Transactions on Semiconductor Manufacturing, vol. 12, No. 2, May 1999, pp. 238-251.*
Gibson et al., D. Statistically Based Parametric Yield Prediction for Integrated Circuits, IEEE Transactions on Semiconductor Manufacturing, vol. 10, No. 4, Nov. 1997, pp. 445-458.*

* cited by examiner

*Primary Examiner*—Russell Frejd

(57) ABSTRACT

A method for a systematic approach to forming experimental designs for large, complex systems after an idea for a product is formed. Critical variables for the product are determined by experts in the field, a design matrix $U_k$ is defined, a base design matrix X is generated, $Y(P)=(I-B(B^TB)^{-1}B^T)[(XP)//U]$ A & Wynn's criterion is defined, where P is a permutation matrix, I is an identity matrix, B is a blocking matrix, $B^T$ is a transposed matrix of B and A is a matrix composed of causal map-based coefficients and wherein a design matrix $U_k$ is created. The index $k \leftarrow k+1$ is set and an algorithm to choose the best of random column permutation matrices P and an algorithm to choose the best column permutation matrix P that is near a previous solution and setting $U_k \leftarrow [XP^k$ with rows from $U_{k-1}$ appended].

14 Claims, 5 Drawing Sheets

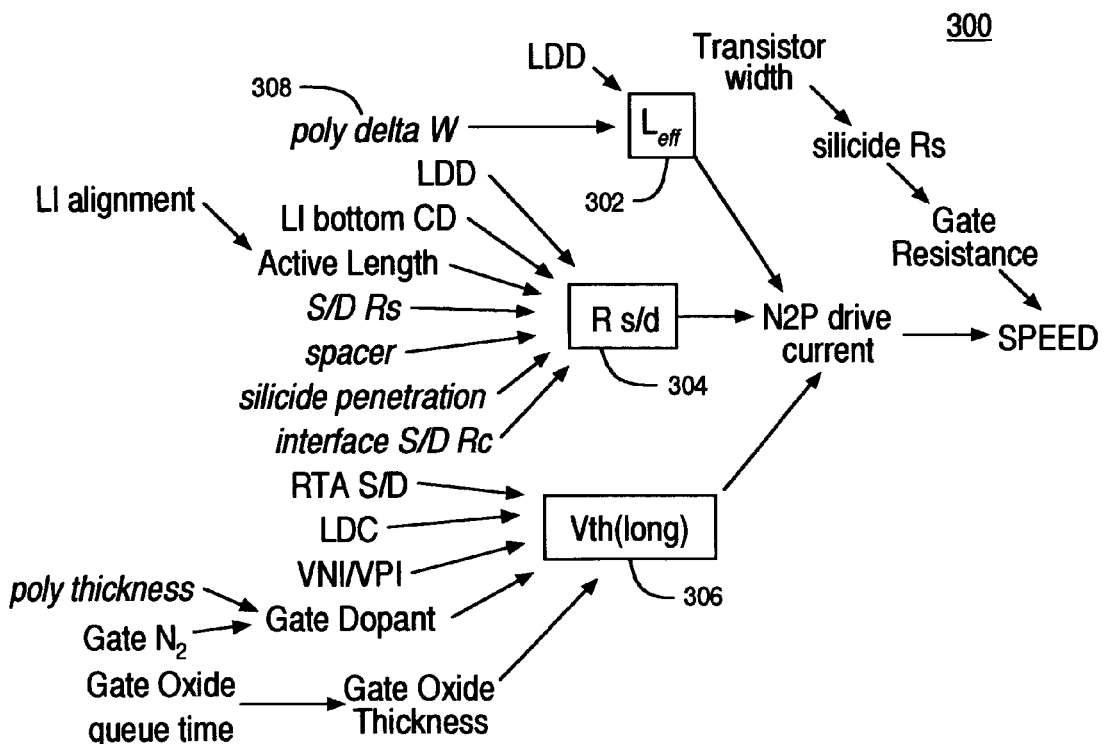
FIGURE 3
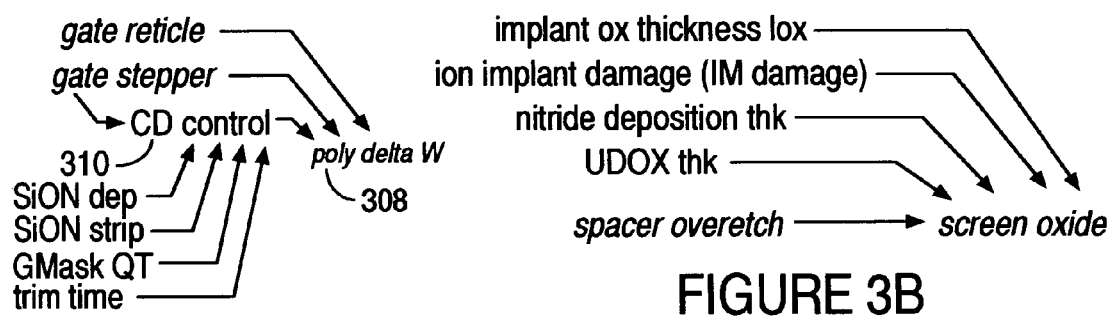
FIGURE 3A
FIGURE 3B
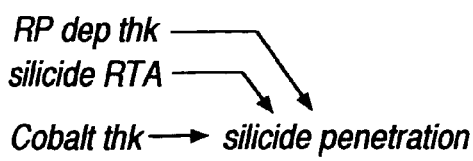
FIGURE 3C
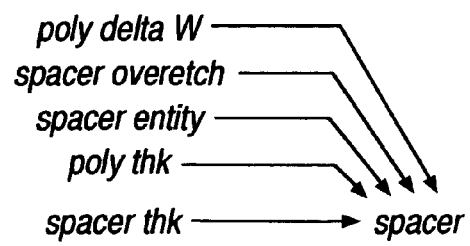
FIGURE 3D

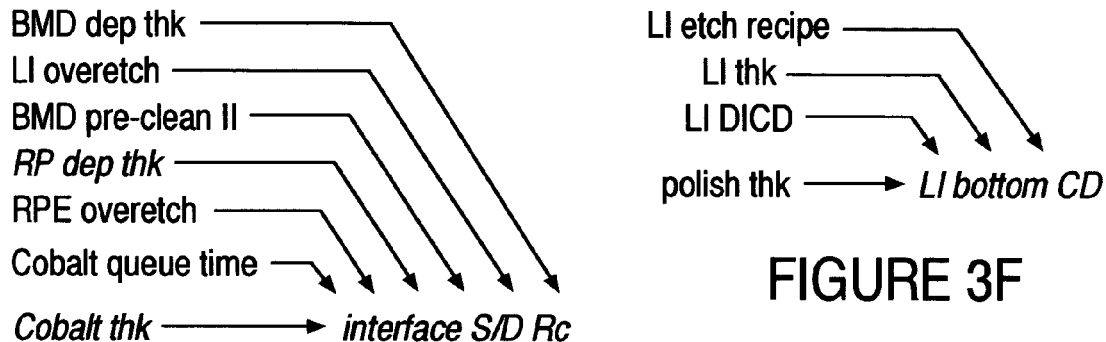
FIGURE 3E
FIGURE 3F
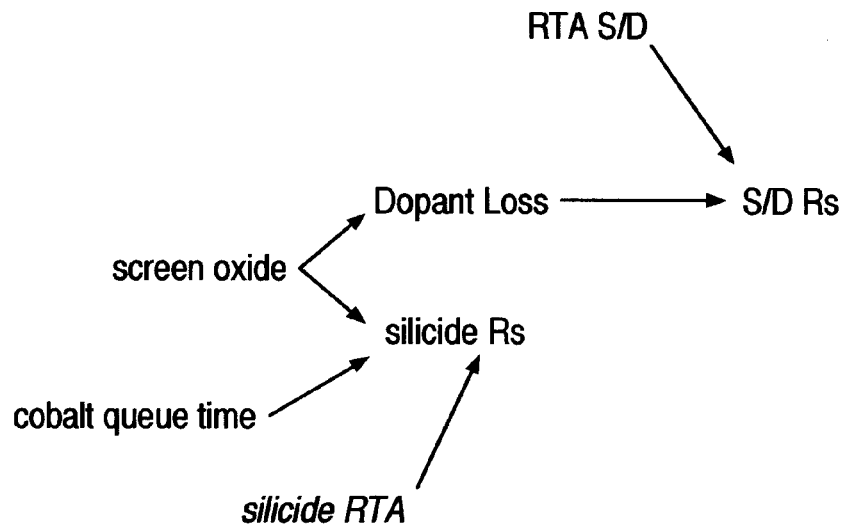
FIGURE 3G

EXPERIMENTAL DESIGN FOR COMPLEX SYSTEMS

BACKGROUND OF THE INVENTION

1. Field of the Invention

This invention relates generally to the manufacture of high performance semiconductor devices. More specifically, this invention relates to a systematic approach to an experimental design for large, complex systems. Even more specifically, this invention relates to a method for systematically designing experiments when prior knowledge of the many factor and multiple responses is expressed as a network of cause-effect relationships.

2. Discussion of the Related Art

The design of a new semiconductor device and the process for manufacturing the new semiconductor device has three phases: the development phase during which processing alternatives are still under evaluation and the nominal process targets continue to be tuned; the pre-production phase during which the process targets are more-or-less set, processing experience is acquired, and appropriate tolerance windows are determined; and the production phase during which both the process target and tolerance windows are more-or-less fixed, and the full resources of the manufacturing line are committed in volume. The present invention focuses on the pre-production phase during which process targets are substantially set, but process experience is to be accumulated, and during which appropriate tolerance windows need to be determined.

The pre-production phase plays an essential role in managing the manufacturing risk factor, providing a time period for determining problematic and challenging process steps, for investigating the range over which product can be manufactured successfully, and for reliability stress testing. The scale of current semiconductor manufacturing processes magnifies all of the issues, for example, contemporary semiconductor processes have 300–400 value added steps, any of which is a source of poor quality and/or reliability. A cost of a single test batch can exceed one quarter million dollars. A delay in market entry equal to one cycle of learning (the production time required to make one batch) approaches two orders of magnitude more.

Competitive pressures have provided strong incentives to keep pre-production costs to an effective minimum. In the statistics literature, it is well recognized that appropriately designed experiments more fully characterize processes than, for example, multiple repetitions of the nominal process. The pre-production assessment of a new semiconductor manufacturing process typically involves many factors and can be from 30–50 and sometimes more, multiple blocks, typically from 5–15 blocks, and several responses, typically from 3–8 responses. One practical constraint is for each experimental block to be self-contained, in the sense that each block supports an analysis without necessarily requiring results from other blocks. A complementary goal has the entire ensemble of experimental blocks covering the process space well. Subject matter expertise is both available and desirable and can be organized as a network of likely cause-effect relationships.

The present invention thus presents a systematic approach to the pre-production problem, including objectives, constraints, overarching model, blocking structures, split and skew factors and self-containing blocks.

SUMMARY OF THE INVENTION

According to the present invention, the foregoing and other objects and advantages are achieved a systematic approach to forming experimental designs for large, complex systems after an idea for a product is formed. In accordance with a first aspect of the invention, critical variables for the product are determined by experts in the field, a design matrix $U_k$ is defined, a base design matrix X is generated, $Y(P)=(I-B(B^TB)^{-1}B^T)[XP]//U]A$ & Wynn's criterion is defined, wherein P is a permutation matrix, I is an identity matrix, B is a blocking matrix, $B^T$ is a transposed matrix B and A is a matrix composed of causal map-based coefficients and wherein a design matrix $U_k$ is created. The index k←k+1 is set and an algorithm to choose the best of random column permutation matrices P and an algorithm to choose the best column permutation matrix P that is near a previous solution and setting $U_k$←[$XP^k$ with rows from $U_{k-1}$ appended].

In accordance with another aspect of the invention, it determined whether the design $U_k$ is large enough and if not the process described above is repeated until the design $U_k$ is large enough. If it is determined that the design $U_k$ is large enough protype products are manufactured, model responses are determined from the prototype wafers and determining whether the model responses are adequate.

In another aspect of the invention, if the model responses are adequate, tolerances for the product are assessed and proposed. If the tolerances assessed and proposed are manufacturable, the product is passed to full-scale production.

In another aspect of the invention, if the model responses are not adequate, the experimental design is repeated to create further $U_k$. This procedure is repeated until a design $U_k$ is achieved that indicates that the model is adequate.

In another aspect of the invention, if the tolerances assessed and proposed are not manufacturable, the design experiment is repeated until a design $U_k$ is achieved that provides a manufacturable product.

The described invention thus provides a method for a systematic approach to forming experimental designs for large, complex systems after an idea for a product is formed.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 3 is a diagram of a Causal-Effect Diagram;

FIGS. 3A–3G are sub-diagrams associated with the Causal—Effect Diagram shown in FIG. 3.

DETAILED DESCRIPTION

Reference is now made in detail to a specific embodiment or specific embodiments of the present invention that illustrate the best mode or modes presently contemplated by the inventors for practicing the invention.

Figure 1:
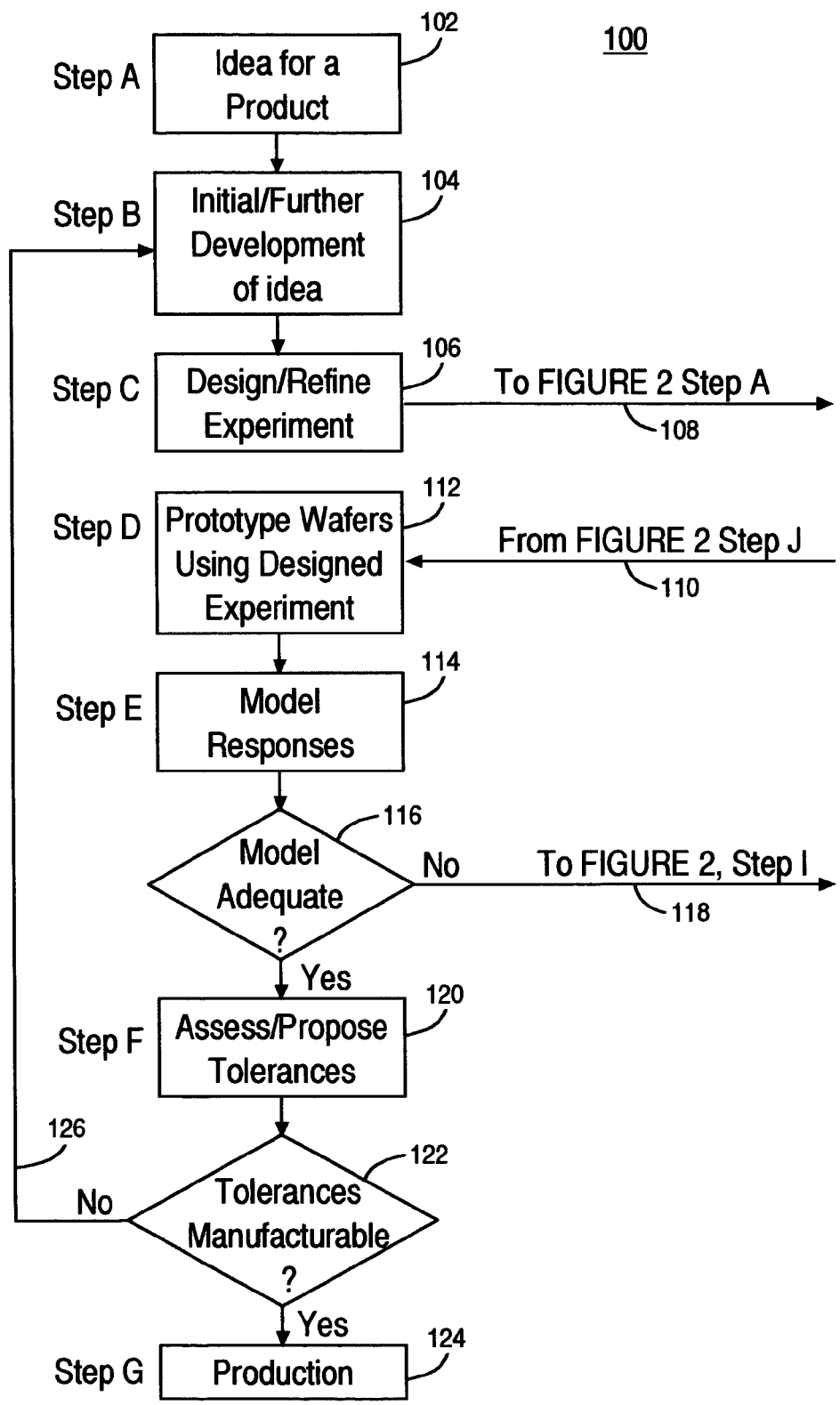
FIG. 1 is a flow diagram showing the steps for the development of a semiconductor device from the "Idea for a Product" to the "Production" of the semiconductor product.
Figure 2:
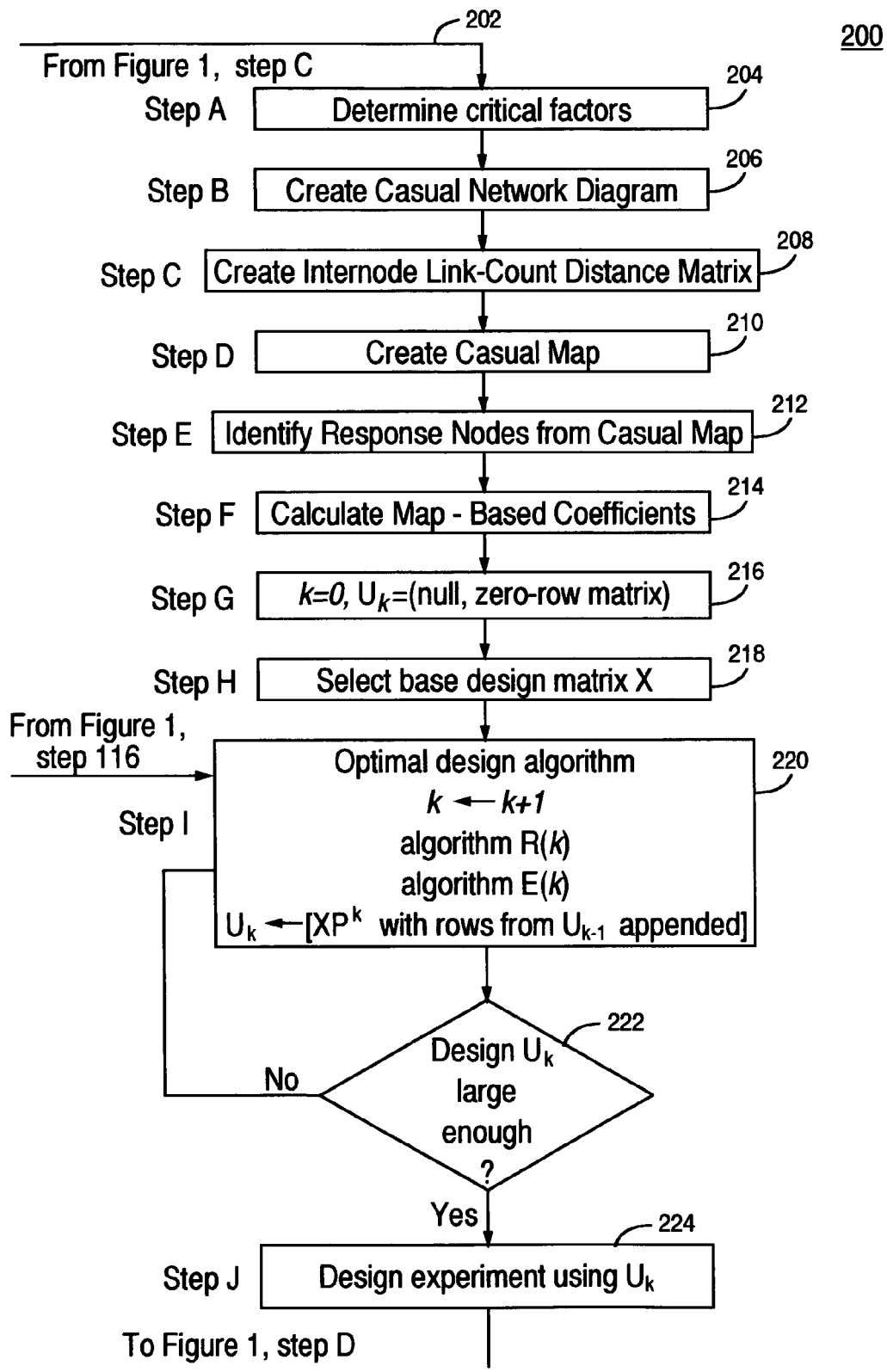
FIG. 2 is flow diagram showing the steps for the pre-production phase of the development of a semiconductor product.

FIG. 1 is a flow diagram 100 showing the steps for the production of a semiconductor device from the initial "idea" for the semiconductor device through the production of the semiconductor device. The first step is the generation of an "Idea for a Product" FIG. 1, Step A, 102. The next step is the "Initial/Further Development of Idea" that comprehends gathering data associated with the desired product, FIG. 1, Step B, 104. The next step is to "Design/Refine Experiment" FIG. 1, Step C, 106 and as indicated by the arrow 108 the flow goes to FIG. 2 Step A. FIG. 2 is a flow diagram 200 showing the steps for the pre-production phase of the present invention and will be discussed below. After the pre-production phase shown in FIG. 2 is completed the flow returns to the flow diagram 100 as shown by arrow 110. Prototype wafers manufactured using designed experimental values are evaluated at 112. The responses from the prototype wafers are empirically measured and mathematically modeled at 114. It is determined at 116 whether the response models are adequate. If the response models are not adequate, the flow returns to FIG. 2, Step I as indicated by arrow 118. If the models are adequate, the next step at 120 is to assess and propose tolerances. It is determined at 122 if the proposed tolerances can be manufactured. If the proposed tolerances can be manufactured, the designed wafers are sent into production at 124. If the proposed tolerances cannot be manufactured, the flow is returned to Step B as indicated by the arrow 126.

FIG. 2 is a flow diagram 200 showing the steps of the pre-production phase of the present invention. Arrow 202 indicates the flow from Step C, FIG. 1. Referring to FIG. 2, Step A, the critical variables for the product and for the manufacturing of the product are determined at 204. The critical variables are determined by experts in the relevant art, in this case, the semiconductor manufacturing art. As an example, the experts determine that the following factors would be the critical variables for the proposed semiconductor product:

| | |
|---|---|
| 1. Speed | 2. N2P |
| 3. Vth | 4. Gate Oxide |
| 5. Gate Resistance | 6. R s/d |
| 7. Leff | 8. LDC |
| 9. LDD | 10. SJD Rs (Source/Drain resistance) |
| 11. PolyDelW | 12. Iox |
| 13. RTA sd (rapid thermal anneal s/d) | 14. DopLoss |
| 15. ScreenOx | 16. spacer |
| 17. spacer Thk | 18. spacer Ent |
| 19. PolyThk | 20. G Dopant (gate dopant) |
| 21. s'cide Rs (silicide resistance | 22. Act Length |
| 23. CD control | 24. SiON Strip (silicon oxynitride strip) |
| 25. G stp | 26. LI bot CD |
| 27. xface s/d Rc | 28. Co QT |
| 29. s'cide pen | 30. G N2.I2 |
| 31. RpdepThk | 32. LI DI CD |
| 33. spacer c/e | 34. s'cide RTA (silicide rapid thermal anneal) |
| 35. Co Thk | 36. XterW (transistor width) |
| 37. VNI/VPI | 38. GateOx QT |
| 39. G R'cle (Gate reticle) | 40. SiON Dep (silicon oxynitride deposition) |
| 41. G Mask QT | 42. Trim Time |
| 43. I2 damage | 44. UDOXthk |
| 45. nitrideDep (nitride deposition) | 46. polishThk (polish thickness) |
| 47. LI etch recipe (local interconnect etch recipe | 48. LI Thk (local interconnect thickness) |
| 49. LI align (local interconnect alignment) | |
| 50. LI o/e | 51. BMD PCII |
| 52. BMD DepThk | 53. RPE o/e |

Generating such lists of responses and factors is a common part of experimental design practice. At one end of the experimental spectrum are small experiments and short lists of especially important variables (responses and factors). Because there weren't efficient experimental methods to incorporate larger numbers of variables, complex systems with larger numbers of variables could not be efficiently designed. The present invention provides a method of efficiently designing larger more complex lists of variables. The ability of efficiently designing experimental designs for the larger more complex lists of variables is the major value of the present invention.

Using the above-listed critical variables, a classical causal network diagram is created, FIG. 2 Step B, 204. The terms "cause-effect diagrams," "causal networks," and "causal maps" are used in various ways in the relevant art. A cause-effect (or CE) diagram consists of a single response (at the head of a central backbone), major factor groups (as spines branching from the backbone), and lower level factors (off each spine), and perhaps branching off from other low level factors. In modern terms, CE diagrams render causal relationships as a strict hierarchy, with the response as the root node, factor groups as the primary branches and other branches expanding therefrom. Causal networks are generalizations of CE diagrams, with three extensions: (1) the number of responses can be more than one, (2) responses can point causally to other responses, and (3) each factor is represented as one and only one node, even though it may contribute to various other responses and/or to higher-level factors. With newly introduced semiconductor manufacturing processes, transistor characterizations have about F=50 factors (F denotes the number of factors of interest) and $F_1$ is about 8 ($F_1$ is the number of factors feasible to vary in any single block), the corresponding causal networks are complicated. For this reason, causal networks are transformed into causal maps.

The transformation of causal networks into causal maps involves the following: (i) the distance between any pair of nodes of a causal network is the minimum number of links of the path connecting them (this is shown below in the internode link-count distance matrix); (ii) the corresponding matrix giving the distances between any pair of nodes is the natural input data structure for multidimensional scaling; and (iii) using a multidimensional scaling algorithm, such as XGvis (Buja et al. 1998) wherein the distance matrix is transformed into node coordinates in D=2 dimensions.

Causal maps that are constructed in this way have extra information that causal networks do not: (1) a factor closer to a response node plausibly has a stronger effect; (2) two factors close together likely share an interaction; (3) responses sharing many factors cluster; and (4) higher-level factors tend toward the map center.

The causal network diagram created using the critical variables is shown in FIGS. 3 & 3A–3G. Establishing which critical variables affect other factors creates the causal-effect network. A causal-effect is in the form "cause =>effect." Some of the critical variables are established as "higher-level responses" and are shown enclosed in boxes. Responses shown in FIG. 3 are "Leff" at 302, "R s/d" at 304 and "Vth(long)" at 306. The sub-diagrams shown in FIGS. 3A–3G show some of the critical variables shown in FIG. 3 with additional critical variables "pointing" to them. For example, a critical factor "poly delta W" shown at 308, FIG. 3 is shown in FIG. 3A with three arrows from critical variables pointing to it. It should be noted that the critical factor "poly delta W" is therefore a response because other critical variables affect it (the number of arrows that are directed toward it), for example, the critical factor "poly delta W" as shown in FIG. 3A has 3 arrows directed towards it directly and 5 arrows directed to another critical factor "CD control" 310 and an arrow from the critical factor "CD control" 310 is directed to the critical factor "poly delta W." Some of the critical variables that are identified as responses, such as the response "poly delta W" are termed "intermediate responses."

Figure 4:
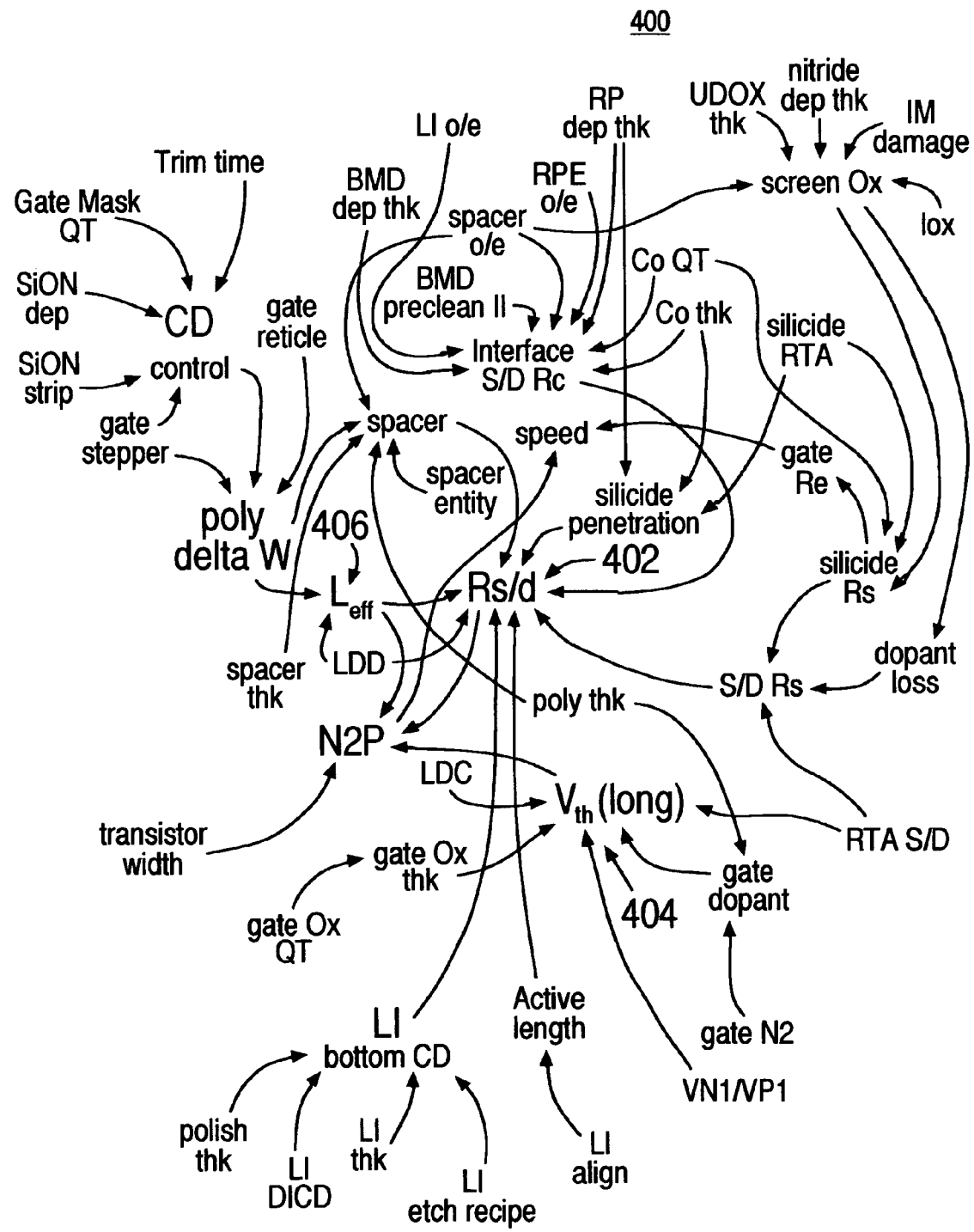
FIG. 4 is a causal map derived from information contained in the Causal-Effect Diagram shown in FIG. 3.

The next step is to create an Internode Link-Count Distance Matrix, FIG. 2, Step C, 208. Table 1 is an "internode link-count distance matrix." The values in the matrix are derived by counting the least number of links from any one node of a factor or response any to any other factor or response in a causal map as shown in FIG. 4. For example, the internode link-count distance "1" from the factor "speed" to the factor "N2P" is obtained by counting the link from the factor "N2P" to the factor "speed." Similarly, the internode link-count distance "2" from the factor "speed" to the factor "Vth" is obtained by counting the link from the factor "Vth" to the factor "N2P" and the link from the factor "N2P" to the factor "speed." The other matrix elements are derived in the same manner.

TABLE 1

INTERNODE LINK-COUNT DISTANCE MATRIX

| Factors (F) | 1 Speed | 2 N2P | 3 Vth | 4 Gate Ox | 5 Gate R | . . . | 51 BMD PCII | BMD DepThk | RPE o/e |
|---|---|---|---|---|---|---|---|---|---|
| 1 Speed | 0 | 1 | 2 | 2 | 1 | | 4 | 4 | 4 |
| 2 N2P | 1 | 0 | 1 | 1 | 2 | | 3 | 3 | 3 |
| 3 Vth | 2 | 1 | 0 | 1 | 3 | | 4 | 4 | 4 |
| 4 Gate Ox | 2 | 1 | 1 | 0 | 3 | | 4 | 4 | 4 |
| 5 Gate R | 1 | 2 | 3 | 3 | 0 | | 4 | 4 | 4 |
| 6 Rs/d | 2 | 1 | 2 | 2 | 3 | | 2 | 2 | 2 |
| 7 Leff | 2 | 1 | 2 | 2 | 3 | | 4 | 4 | 4 |
| 8 LDC | 3 | 2 | 1 | 2 | 4 | | 5 | 5 | 5 |
| 9 LDD | 3 | 2 | 3 | 3 | 4 | | 3 | 3 | 3 |
| 10 S/D Rs | 3 | 2 | 2 | 3 | 2 | | 3 | 3 | 3 |
| 11 PolyDelW | 3 | 2 | 3 | 3 | 4 | | 4 | 4 | 4 |
| 12 Iox | 4 | 5 | 5 | 6 | 3 | | 4 | 4 | 4 |
| 13 RTAsd | 3 | 2 | 1 | 2 | 3 | | 4 | 4 | 4 |
| 14 DopLoss | 4 | 3 | 3 | 4 | 3 | | 4 | 4 | 4 |
| 15 ScreenOx | 3 | 4 | 4 | 5 | 2 | | 3 | 3 | 3 |
| 16 spacer | 3 | 2 | 3 | 3 | 4 | | 3 | 3 | 3 |
| 17 spacer Thk | 4 | 3 | 4 | 4 | 5 | | 4 | 4 | 4 |
| 18 spacer Ent | 4 | 3 | 4 | 4 | 5 | | 4 | 4 | 4 |
| 19 PolyThk | 4 | 3 | 2 | 3 | 5 | | 4 | 4 | 4 |
| 20 G Dopant | 3 | 2 | 1 | 2 | 4 | | 5 | 5 | 5 |
| 21 s'cide Rs | 2 | 3 | 3 | 4 | 1 | | 3 | 3 | 3 |
| 22 Act Length | 3 | 2 | 3 | 3 | 4 | | 3 | 3 | 3 |
| 23 CD control | | | | | | | | | |
| 24 SiON strip | | | | | | | | | |
| 25 G stp | | | | | | | | | |
| 26 LI bot CD | | | | | | | | | |
| 27 xface s/d Rc | | | | | | | | | |
| 28 Co QT | | | | | | | | | |
| 29 s'cide pen | | | | | | | | | |
| 30 G N2.I2 | | | | | | | | | |
| 31 RpdepThk | | | | | | | | | |
| 32 LI DI CD | | | | | | | | | |
| 33 spacer c/e | | | | | | | | | |

TABLE 1-continued

INTERNODE LINK-COUNT DISTANCE MATRIX

| Factors (F) | 1 Speed | 2 N2P | 3 Vth | 4 Gate Ox | 5 Gate R | ... | 51 BMD PCII | BMD DepThk | RPE o/e |
|---|---|---|---|---|---|---|---|---|---|
| 34 s'cide RTA | | | | | | | | | |
| 35 Co Thk | | | | | | | | | |
| 36 XterW | | | | | | | | | |
| 37 VNL/VPI | | | | | etc. | | | | |
| 38 GateOx QT | | | | | | | | | |
| 39 G R'cle | | | | | | | | | |
| 40 SiON Dep | | | | | | | | | |
| 41 G Mask QT | | | | | | | | | |
| 42 TrimTime | | | | | | | | | |
| 43 I2 damage | | | | | | | | | |
| 44 UDOXthk | | | | | | | | | |
| 45 nitrideDep | | | | | | | | | |
| 46 polishThk | | | | | | | | | |
| 47 LI etch recipe | | | | | | | | | |
| 48 LI Thk | | | | | | | | | |
| 49 LI align | | | | | | | | | |
| 50 LI o/e | | | | | | | | | |
| 51 BMD PCII | | | | | | | | | |
| 52 BMD DepThk | | | | | | | | | |
| 53 RPE o/e | | | | | | | | | |

When the Internode Link-Count Distance Matrix is determined, the next step is to apply a multidimensional scaling algorithm to create a D-dimensional (D typically 2 or 3) set of node coordinates called a causal map. Especially when D=2, one can plot the nodes as points on rectangular graph paper, and so both the coordinates themselves and the resulting graph 400, FIG. 4 are called causal maps. One example of a multidimensional scaling algorithm is XGvis. Its application to visualizing networks is known and is conventional practice.

The next step is to create a Causal Map, FIG. 2, Step D, 210. FIG. 4 shows the Causal Map 400 derived from information contained in the causal network shown in FIGS. 3 & 3A–3G and from information contained in the Internode Link-Count Distance Matrix, Table 2.

Once the Causal Map is determined, the next step is to Identify Response Nodes, FIG. 2, Step E, 212. An inspection of the Causal Map 400, FIG. 4 shows that the key responses move towards the center and are R s/d, n and p, at 402, $V_{th}$, n and p, at 404 and $L_{eff}$, n and p, at 406. It is noted that part of the selection of key responses is the exercise of engineering judgment and additional selections or alternate selections could be made.

After the values in Table 1 are determined and after the Key Responses are determined the next step is to calculate the Map-Based Coefficients $a_{ij}$, FIG. 2, Step F, 214. Table 2 shows the Matrix A (columns $V_{th}$,n to $L_{eff}$,p of Table 2 make up Matrix A) with values $a_{i,j}$ derived from information contained in Table 1 & FIG. 2, Step F, at 214.

The following example shows how the values in Table 2 are calculated. Suppose the causal network has factors f1, f2, and f3 all pointing to response r0 having values determined from a similar Internode Link-Count Distance Matrix as shown in Table 1. The portion of the internode link-count distance matrix is:

$$\begin{array}{c c} & \begin{array}{cccc} r0 & f1 & f2 & f3 \end{array} \\ \begin{array}{c} r0 \\ f1 \\ f2 \\ f3 \end{array} & \left[ \begin{array}{cccc} 0 & 1 & 1 & 1 \\ 1 & 0 & 2 & 2 \\ 1 & 2 & 0 & 2 \\ 1 & 2 & 2 & 0 \end{array} \right] \end{array}$$

The causal map coordinates in 2 dimensions (D=2) are approximately:

$$\begin{array}{c c} & \begin{array}{cc} dim1 & dim2 \end{array} \\ \begin{array}{c} r0 \\ f1 \\ f2 \\ f3 \end{array} & \left[ \begin{array}{cc} 0 & 0 \\ 1 & 0 \\ -0.5 & 0.866 \\ -0.5 & -0.866 \end{array} \right] \end{array}$$

Note: r0 is in the middle and f1,f2, and f3 form an equilateral triangle around r0.

The distance between $f_i$ and $f_j$ is square root of 3 (not quite 2), but the distance between r0 and $f_i$ is 1. The multidimensional scaling would try to balance this, and so the causal map in D=2 might be approximately 1.3 times the above, as shown below:

$$\begin{array}{c c} & \begin{array}{cc} dim1 & dim2 \end{array} \\ \begin{array}{c} r0 \\ f1 \\ f2 \\ f3 \end{array} & \left[ \begin{array}{cc} 0 & 0 \\ 1.3 & 0 \\ -0.65 & 1.126 \\ -0.65 & -1.126 \end{array} \right] \end{array}$$

Note: The distances between $f_i$ and $f_j$ are 2.252 and the distance between r0 and $f_i$ is 1.3.

The coefficient is determined as follows:

$(r0, f_i) = e^{(\alpha * distance(r0, fi)^2)} = e^{(-\alpha * 1.3 * 1.3)} = e^{-69}$, since $\alpha \sim 1$, then $(r0, f_i) = 0.185$.

The matrix would then be:
r0
f1 0.185
f2 −0.185*
f3 0.185

*The negative sign for factor f2 is applied by experience and indicates that an increase in the value of factor f2 produces a decrease in the response r0.

TABLE 2

| | Map Based Coefficients (Matrix A) | | | | | |
|---|---|---|---|---|---|---|
| knob | Vth,n | R s/d,n | Leff,n | Vth,p | R s/d,p | Leff,p |
| 1 XterW | | −0.107888 | | | −0.107888 | |
| 2 I2 damage | | 0.025962 | | | | |
| 3 VNI | −0.221786 | | | | | |
| 4 VPI | | | | 0.221786 | | |
| 5 GateOx QT | 0.137194 | | −0.137194 | | | |
| 6 Gate Ox | 0.246187 | | −0.246187 | | | |
| 7 PolyThk | 0.116432 | 0.119731 | | −0.116432 | 0.119731 | |
| 8 G N2.I2 | −0.052234 | | −0.104468 | | | |
| 9 SiOn Dep | | | 0.065866 | | | 0.065866 |
| 10 G Mask QT | | | 0.060969 | | | 0.060969 |
| 11 G stp | | | 0.158818 | | | 0.158818 |
| 12 SiON strip | | | −0.064624 | | | −0.064624 |
| 13 LDC n | −0.179057 | | −0.196067 | | | |
| 14 LDC p | | | | 0.179057 | | −0.196067 |
| 15 LDD n | | −0.227165 | −0.166824 | | | |
| 16 LDD p | | | | | −0.227165 | −0.166824 |
| 17 UDOX1 | | 0.082092 | | | 0.082092 | |
| 18 Iox | | 0.025134 | | | 0.025134 | |
| 19 spacer Thk | | 0.108862 | 0.109174 | | 0.108862 | 0.109174 |
| 20 spacer o/e | | −0.152447 | −0.108867 | | −0.152447 | −0.108867 |
| 21 spacEtchEnt | | | | | | |
| 22 UDOX2 | | 0.026926 | | | 0.026926 | |
| 23 RpdepThk | | −0.10924 | | | −0.10924 | |
| 24 RTAsd | −0.202057 | −0.113617 | −0.069277 | 0.202057 | −0.113617 | −0.069277 |
| 25 RPE o/e | | −0.107437 | | | −0.107437 | |
| 26 Co QT | | 0.109251 | | | 0.109251 | |
| 27 Co Thk | | −0.113116 | | | −0.113116 | |
| 28 s'cide RTA1 | | −0.116867 | | | −0.116867 | |
| 29 s'cide RTA2 | | −0.116867 | | | −0.116867 | |
| 30 LI Thk | | −0.096417 | | | −0.096417 | |
| 31 polish Thk | | 0.09219 | | | 0.09219 | |
| 32 LI DICD | | −0.87249 | | | −0.087249 | |
| 33 LI alignX | | 0.078742 | | | 0.078742 | |
| 34 LI alignY | | 0.078742 | | | 0.078742 | |
| 35 LI o/e | | 0.106432 | | | 0.106432 | |
| 36 BMDDepTh | | 0.101266 | | | 0.101266 | |
| 37 BMD PCII | | 0.101964 | | | 0.101964 | |

Note:
Blanks (or zeros) indicate that a particular critical factor does not affect the particular response, i.e., there is no "cause-effect."

After the map-based coefficients (Matrix A) are determined, FIG. 2, Step F, 214, k is set to 0 and the matrix $U_k$=(null, zero-row matrix), FIG. 2, Step G, 216.

An initial base design matrix, X, is established by statistician experts in the field, FIG. 2, Step H, 218. The base design matrix X shows in a generic way the form of the design; it is generic in the sense that particular factors are not yet assigned to particular X-columns.

Table 3 show two design alternatives, one design alternative is a "split-plot only design" and the other is an "interblock" design. The split-plot design varies factors only within the lot (block). The interblock design varies factors both from lot to lot and within lot. The former set of factors are conventionally termed skew factors, the latter are termed split factors. In each of the two design alternatives $L_8$ and $L'_8$ are matrices as follows:

$$L_8 = \begin{bmatrix} - & - & - & - \\ + & - & - & + \\ - & + & - & + \\ + & + & - & - \\ - & - & + & + \\ + & - & + & + \\ - & + & + & - \\ + & + & + & + \end{bmatrix}$$

and $$L'_8 = \begin{bmatrix} - & - & - & + \\ + & - & - & - \\ - & + & - & - \\ + & + & - & - \\ - & - & + & - \\ + & - & + & + \\ - & + & + & + \\ + & + & + & - \end{bmatrix}$$

TABLE 3 split-plot design / interblock design (matrix representation with [L₈] and [L'₈] blocks; entries of 0, +, − denoting design levels)

P is a permutation matrix and the matrix product XP constitutes a rearrangement of the columns X. The matrix A is a matrix of coefficients linking (linearly) the full 37 dimensional space to the 6 dimensional intermediate variable space, (37 factors (first column) and 6 responses (column headings) Table 2). The established initial design matrix X does not associate particular factors with particular columns of X, but it does describe the overall patterns of the experiment, that is, how many split factors per block, how many skew factors per block, how many runs (wafers) per block. A block is a set of experimental runs (wafers) processed together (in semiconductor processing; a lot). Split factors are factors that take on at least two values within a given lot (block). Skew factors are factors that take on different values from nominal (0), but are constant within the block.

For any particular assignment of X-columns to factors one can compute a score. This score is related to a prediction of how spread out the eventual results (responses) measured on the wafers (runs, rows of X) are predicted to be. The better designs will have better (higher) scores. This number is calculated by assigning particular columns of X to particular factors, one-to-one, with no duplicate assignments and no factors left out.

A list-to-list assignment, with a score about which assignments are worse or better, is known as "the traveling salesman problem." In the conventional description of the traveling salesman problem, a salesman needs to visit a list of cities once each and wants to minimize the driving time. In that context, a salesman has one list—of cites—and another list, the number 1, 2, 3, 4, and needs to assign each number to each city. Assigning 1 to city B means visit that city first, 2 to city D means visit that city second, and so on. Such an algorithm gives an X-column-to-factor assignment with the biggest score of any assignment considered. The R step/E step algorithm discussed below is one particular traveling-salesman-solving algorithm.

Conceptually, if an assignment is made of X-columns and factors at random and if another random assignment is made, there is a 50% chance that a higher score would be obtained. If a third random assignment is made, there is a chance of 33% of achieving a higher score than the previous two assignments, etc. As can be appreciated, random guessing (R step) bogs down and offers no improvement after numerous tries. What is done is pick the best so far and see if, swapping just one pair of factors' X-columns achieves a higher score. Doing this one pair at a time for all pairs of factors is the done by the E algorithm discussed below and is repeated until all pairs have been examined without an improvement.

The optimal design algorithm including the algorithm R(k) and the algorithm E(k) are run with k=k+1. FIG. 2, Step I, 220. $Y(P)=(I-B(B^TB)^{-1}B^T)[(X\ P)/IU]$ A & Wynn's criterion is run. Note that the term $(I-B(B^TB)^{-1}B^T)$ is a projection matrix that acts to filter out effects correlated with B, leaving only effects not correlated with B, that is, it serves as a blocking function. B is a matrix of dummy variables representing the blocks. After Y(P) is defined, the algorithms R(k) and E(k) are run. R(k) is an algorithm to choose the best of $n_r$ random column permutation matrices P. E(k) is an algorithm is to choose the best column permutation matrix P that is "near" a previous solution. (On the first iteration of algorithm E, the previous solution comes from algorithm R; thereafter, the previous solution comes from the last application of algorithm E.) Note that A//B means: "append the rows of B to the rows of A, with the rows of A on top.

Wynn's criterion: If $\{y_i: i=1 \ldots n\}$ denotes a set of k-dimensional points comprising a possible experimental design, and the n×n matrix C is defined with typical element $c(i,j)=\exp(-\|y_i-y_j\nu^2)$. Wynn's criterion is that a design $\{y_i\}$ is better when detC. is larger ("det" denotes the matrix determinant). If C is interpreted as a correlation matrix, det(C) represents the generalized variance, which Wynn's criterion maximizes. This is achieved by moving the points $\{y_i: i=1 \ldots n\}$ far from one another.

C, such that $C(i,j)=\exp\{-\|y_i-y_j\|^2\}$. Distances among points $\{y_i\}$ are transformed into "correlations" as discussed above. The points $\{y_i\}$ are the rows of matrix Y(P).

Algorithm R (k):

Let X' denote the best current design, with criterion value c', which is a scalar and initially c'=−∞.

Loop in r=1 to $n_R$
        Randomly rearrange columns of base design matrix X, resulting in $X_r$
        Form $W_r$ by adding to matrix $X_r$ the rows of $U_{k-1}$
        $Y_{r1}=W_rA$
        $Y_{r2}=[I-B(B^TB)^{-1}B^T]Y_{r1}$
        $c_r=detC(Y_{r1})\times detC(Y_{r2})$
        if it is determined at 222, FIG. 2, that $c_r$>c' then X'=$X_r$ and c'=$c_r$
    end Loop r.

The function of algorithm R is to choose the best of $n_r$ random column permutation matrices P.

Algorithm E(k):

Let X' denote the best current design, with criterion value c', the scalar from algorithm R.

Label E: NoImprovement=true
    X"=X'
    c"=c'
    Loop in i=1 to n−1
        Loop in j=i+1 to n
        Form matrix $X_{ij}$ by swapping columns i,j of X'
        Form Wij by adding to matrix $X_{ij}$ the rows of $U_{k-1}$*
        $Y_{e1}=W_{ij}A$
        $Y_{e2}=[I-B(B^TB)^{-1}B^T]Y_{e1}$
        $c_{ij}=detC(Y_{e1})\times detC(Y_{e2})$
        If $c_{ij}$>c", then X"=$X_{ij}$ and c"=$c_{ij}$, NoImprovement=false
        end Loop j
    end Loop i if NoImprovement then STOP else go to Label E.

Note 1: If a factor with a strong factor is split, $Y_{r1}$ & $Y_{r2}$ are both more dispersed, hence larger criterion. If some factor is skewed instead, $Y_{r1}$ is dispersed, but not $Y_{r2}$. In this way this criterion gives double points for splitting strong factors.

Note 2: It is conventional practice for statisticians to term vertical elements as "columns" and the horizontal elements as "rows."

Tables 4–6 are examples of designs and solutions for particular 18-wafer lots and were extracted from a larger solution of 6–8 lots. Each design and solution, for example, the design and solution in Table 4 is a design $U_k$ indicated at 224, FIG. 2, Step J.

After the optimal design algorithm is run Step I, FIG. 2, 220 is run it is determined at 222 if the design $U_k$ is large enough. If it is determined at 220 that there the design $U_k$ is not large enough the flow returns to Step I and the optimal design algorithm is repeated until it is determined at 222 that the design $U_k$ is large enough. When this occurs the flow goes to Step J and the design experiment $U_k$ is complete and the flow returns to FIG. 1, Step D as indicated by arrow 226.

When the flow returns to Step D, FIG. 1, prototype wafers using the designed experiment are manufactured. As discussed above, Tables 4–6 each show I lot (18 wafers) of a solution and design that could be 6–8 wafers. The manufactured prototype wafers are tested and model responses are measured at 114, FIG. 1, Step E.

It is determined at 116 whether the Model Responses are adequate. If the model responses are not adequate, the flow returns to Step I, FIG. 2 as indicated by arrow 118. Step I, FIG. 2 is the step of running the Optimal design algorithm and Steps I, FIG. 2 through Step E, FIG. 1 are repeated until it is determined at 116, FIG. 1 that the model is adequate.

After the model is determined to be adequate at 116, the tolerances are assessed/proposed at Step F, FIG. 1, 120. Whether the proposed tolerances are manufacturable is determined at 122, FIG. 1 and if the proposed tolerances are not manufacturable, the flow returns to Step B as indicated by arrow 126. The development of the idea then begins anew at Step B. If it is determined at 122, FIG. 1 that the proposed tolerances are manufacturable, the best solution of the design is sent to production at Step G, FIG. 1, 124.

Table 4 is a lot (block) of 18 wafers and the total solution could be 6–8 lots. After a total number of lots is completed, the wafers are manufactured and tested to validate the experiment and to choose the best set of factors to use for full scale production.

Table 4 is an example Split Sheet for one of 6 lots and is a part of a matrix [XP] and shows the results of running the optimization algorithm. A split sheet includes instructions for processing the wafers, of one particular lot (one block). Format is $(XP)^T$: that is, the columns are wafers in a split sheet, and the rows are factors. (Conventional experimental design notation has a reverse convention: the rows (the vertical elements) are wafers and the columns (the horizontal elements) are factors.)

TABLE 4

| Factor | wafer # → | | | | | | | | | | | | | | | | | | |
|---|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 | |
| 1 XterW | 0 | 0 | 0 | 0 | 0 | 0 | 0 | 0 | 0 | 0 | 0 | 0 | 0 | 0 | 0 | 0 | 0 | 0 | |
| 2 I2 damage | 0 | − | − | − | − | − | − | − | − | − | − | − | − | − | − | − | − | 0 | <=** |

TABLE 4-continued

| | Factor | wafer # → | | | | | | | | | | | | | | | | | | |
|---|---|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 | 16 | 17 | 18 | |
| =>* | 3 VNI | 0 | − | + | + | − | − | + | + | − | + | − | − | + | + | − | − | + | 0 | |
| | 4 VPI | 0 | − | − | − | − | − | − | − | − | − | − | − | − | − | − | − | − | 0 | <= |
| | 5 GateOx QT | 0 | − | − | − | − | − | − | − | − | − | − | − | − | − | − | − | − | 0 | <= |
| | 6 GateOx | 0 | − | − | − | − | − | − | − | − | − | − | − | − | − | − | − | − | 0 | <= |
| | 7 PolyThk | 0 | − | − | − | − | − | − | − | − | − | − | − | − | − | − | − | − | 0 | <= |
| => | 8 G N2 I2 | 0 | − | − | + | + | − | − | + | + | − | − | + | + | − | − | + | + | 0 | |
| | 9 SiOn Dep | 0 | 0 | 0 | 0 | 0 | 0 | 0 | 0 | 0 | 0 | 0 | 0 | 0 | 0 | 0 | 0 | 0 | 0 | |
| | 10 G Mask QT | 0 | 0 | 0 | 0 | 0 | 0 | 0 | 0 | 0 | 0 | 0 | 0 | 0 | 0 | 0 | 0 | 0 | 0 | |
| | 11 G stp | 0 | 0 | 0 | 0 | 0 | 0 | 0 | 0 | 0 | 0 | 0 | 0 | 0 | 0 | 0 | 0 | 0 | 0 | |
| | 12 SiOn strip | 0 | − | − | − | − | − | − | − | − | − | − | − | − | − | − | − | − | 0 | <= |
| => | 13 LDC n | 0 | − | − | − | − | − | − | − | − | + | + | + | + | + | + | + | + | 0 | |
| | 14 LDC p | 0 | − | − | − | − | − | − | − | − | − | − | − | − | − | − | − | − | 0 | <= |
| | 15 Iox | 0 | 0 | 0 | 0 | 0 | 0 | 0 | 0 | 0 | 0 | 0 | 0 | 0 | 0 | 0 | 0 | 0 | 0 | |
| | 16 LDD n | 0 | − | + | − | + | − | + | − | + | − | + | − | + | − | + | − | + | 0 | |
| | 17 LDD p | 0 | − | − | − | − | − | − | − | − | − | − | − | − | − | − | − | − | 0 | <= |
| | 18 UDOX1 | 0 | 0 | 0 | 0 | 0 | 0 | 0 | 0 | 0 | 0 | 0 | 0 | 0 | 0 | 0 | 0 | 0 | 0 | |
| | 19 spacer Thk | 0 | 0 | 0 | 0 | 0 | 0 | 0 | 0 | 0 | 0 | 0 | 0 | 0 | 0 | 0 | 0 | 0 | 0 | |
| | 20 spacer o/e | 0 | − | − | − | − | − | − | − | − | − | − | − | − | − | − | − | − | 0 | |
| => | 21 spacerEtchEnt | 0 | − | + | + | − | + | − | − | + | − | + | + | − | + | − | − | + | 0 | |
| | 22 UDOX2 | 0 | 0 | 0 | 0 | 0 | 0 | 0 | 0 | 0 | 0 | 0 | 0 | 0 | 0 | 0 | 0 | 0 | 0 | |
| | 23 RpdepThk | 0 | 0 | 0 | 0 | 0 | 0 | 0 | 0 | 0 | 0 | 0 | 0 | 0 | 0 | 0 | 0 | 0 | 0 | |
| => | 24 RTAsd | 0 | − | − | − | − | + | + | + | + | − | − | − | − | + | + | + | + | 0 | |
| | 25 RPE o/e | 0 | 0 | 0 | 0 | 0 | 0 | 0 | 0 | 0 | 0 | 0 | 0 | 0 | 0 | 0 | 0 | 0 | 0 | |
| | 26 Co QT | 0 | 0 | 0 | 0 | 0 | 0 | 0 | 0 | 0 | 0 | 0 | 0 | 0 | 0 | 0 | 0 | 0 | 0 | |
| | 27 Co Thk | 0 | 0 | 0 | 0 | 0 | 0 | 0 | 0 | 0 | 0 | 0 | 0 | 0 | 0 | 0 | 0 | 0 | 0 | |
| | 28 s'cide RTA1 | 0 | − | − | − | − | − | − | − | − | − | − | − | − | − | − | − | − | 0 | <= |
| | 29 s'cide RTA2 | 0 | − | − | − | − | − | − | − | − | − | − | − | − | − | − | − | − | 0 | <= |
| | 30 LI Thk | 0 | 0 | 0 | 0 | 0 | 0 | 0 | 0 | 0 | 0 | 0 | 0 | 0 | 0 | 0 | 0 | 0 | 0 | |
| | 31 polishThk | 0 | 0 | 0 | 0 | 0 | 0 | 0 | 0 | 0 | 0 | 0 | 0 | 0 | 0 | 0 | 0 | 0 | 0 | |
| | 32 LI DICD | 0 | − | − | − | − | − | − | − | − | − | − | − | − | − | − | − | − | 0 | <= |
| | 33 LI alignX | 0 | 0 | 0 | 0 | 0 | 0 | 0 | 0 | 0 | 0 | 0 | 0 | 0 | 0 | 0 | 0 | 0 | 0 | |
| | 34 LI alignY | 0 | 0 | 0 | 0 | 0 | 0 | 0 | 0 | 0 | 0 | 0 | 0 | 0 | 0 | 0 | 0 | 0 | 0 | |
| | 35 LI o/e | 0 | 0 | 0 | 0 | 0 | 0 | 0 | 0 | 0 | 0 | 0 | 0 | 0 | 0 | 0 | 0 | 0 | 0 | |
| | 36 BMD DepThk | 0 | 0 | 0 | 0 | 0 | 0 | 0 | 0 | 0 | 0 | 0 | 0 | 0 | 0 | 0 | 0 | 0 | 0 | |
| | 37 BMD PCII | 0 | 0 | 0 | 0 | 0 | 0 | 0 | 0 | 0 | 0 | 0 | 0 | 0 | 0 | 0 | 0 | 0 | 0 | |

*The left-side arrows indicate, "split factors."
**The right-side arrows mean that the factors varied in this lot for lot-to-lot experiment (skew factors).

Note: In Tables 4–6, the "0" means that the factor has not been increased or decreased from the nominal value, that the "−" means that the factor has been decreased and that the "+" means that the factor has been increased.

TABLE 5

| Factor | wafer # → | | | | | | | | | | | | | | | | | |
|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 |
| 1 XterW | 0 | 0 | 0 | 0 | 0 | 0 | 0 | 0 | 0 | 0 | 0 | 0 | 0 | 0 | 0 | 0 | 0 | 0 |
| 2 I2 damage | 0 | 0 | 0 | 0 | 0 | 0 | 0 | 0 | 0 | 0 | 0 | 0 | 0 | 0 | 0 | 0 | 0 | 0 |
| 3 VNI | 0 | 0 | 0 | 0 | 0 | 0 | 0 | 0 | 0 | 0 | 0 | 0 | 0 | 0 | 0 | 0 | 0 | 0 |
| 4 VPI | 0 | −1 | −1 | −1 | −1 | −1 | −1 | −1 | −1 | 1 | 1 | 1 | 1 | 1 | 1 | 1 | 1 | 0 |
| 5 GateOx | 0 | 0 | 0 | 0 | 0 | 0 | 0 | 0 | 0 | 0 | 0 | 0 | 0 | 0 | 0 | 0 | 0 | 0 |
| 6 GateOx | 0 | 0 | 0 | 0 | 0 | 0 | 0 | 0 | 0 | 0 | 0 | 0 | 0 | 0 | 0 | 0 | 0 | 0 |
| 7 PolyThk | 0 | 0 | 0 | 0 | 0 | 0 | 0 | 0 | 0 | 0 | 0 | 0 | 0 | 0 | 0 | 0 | 0 | 0 |
| 8 G N2 I2 | 0 | 0 | 0 | 0 | 0 | 0 | 0 | 0 | 0 | 0 | 0 | 0 | 0 | 0 | 0 | 0 | 0 | 0 |
| 9 SiOn Dep | 0 | 0 | 0 | 0 | 0 | 0 | 0 | 0 | 0 | 0 | 0 | 0 | 0 | 0 | 0 | 0 | 0 | 0 |
| 10 G Mask QT | 0 | 0 | 0 | 0 | 0 | 0 | 0 | 0 | 0 | 0 | 0 | 0 | 0 | 0 | 0 | 0 | 0 | 0 |
| 11 G stp | 0 | 0 | 0 | 0 | 0 | 0 | 0 | 0 | 0 | 0 | 0 | 0 | 0 | 0 | 0 | 0 | 0 | 0 |
| 12 SiOn strip | 0 | 0 | 0 | 0 | 0 | 0 | 0 | 0 | 0 | 0 | 0 | 0 | 0 | 0 | 0 | 0 | 0 | 0 |
| 13 LDC n | 0 | −1 | −1 | −1 | −1 | 1 | 1 | 1 | 1 | −1 | −1 | −1 | −1 | 1 | 1 | 1 | 1 | 0 |
| 14 LDC p | 0 | −1 | 1 | −1 | 1 | 1 | −1 | 1 | −1 | 1 | −1 | 1 | −1 | 1 | −1 | 1 | −1 | 0 |
| 15 Iox | 0 | 0 | 0 | 0 | 0 | 0 | 0 | 0 | 0 | 0 | 0 | 0 | 0 | 0 | 0 | 0 | 0 | 0 |
| 16 LDD n | 0 | −1 | 1 | −1 | 1 | −1 | 1 | −1 | 1 | −1 | 1 | −1 | 1 | −1 | 1 | −1 | 1 | 0 |
| 17 LDD p | 0 | −1 | −1 | 1 | 1 | 1 | 1 | −1 | −1 | 1 | 1 | −1 | −1 | −1 | −1 | 1 | 1 | 0 |
| 18 UDOX1 | 0 | 0 | 0 | 0 | 0 | 0 | 0 | 0 | 0 | 0 | 0 | 0 | 0 | 0 | 0 | 0 | 0 | 0 |
| 19 spacer Thk | 0 | 0 | 0 | 0 | 0 | 0 | 0 | 0 | 0 | 0 | 0 | 0 | 0 | 0 | 0 | 0 | 0 | 0 |
| 20 spacer o/e | 0 | −1 | 1 | 1 | −1 | −1 | 1 | −1 | −1 | 1 | 1 | −1 | 1 | −1 | 1 | 1 | −1 | 0 |
| 21 spacerEtchEnt | 0 | 0 | 0 | 0 | 0 | 0 | 0 | 0 | 0 | 0 | 0 | 0 | 0 | 0 | 0 | 0 | 0 | 0 |
| 22 UDOX2 | 0 | 0 | 0 | 0 | 0 | 0 | 0 | 0 | 0 | 0 | 0 | 0 | 0 | 0 | 0 | 0 | 0 | 0 |
| 23 RpdepThk | 0 | 0 | 0 | 0 | 0 | 0 | 0 | 0 | 0 | 0 | 0 | 0 | 0 | 0 | 0 | 0 | 0 | 0 |
| 24 RTAsd | 0 | −1 | 1 | 1 | −1 | −1 | 1 | 1 | −1 | 1 | −1 | −1 | 1 | 1 | −1 | −1 | 1 | 0 |
| 25 RPE o/e | 0 | 0 | 0 | 0 | 0 | 0 | 0 | 0 | 0 | 0 | 0 | 0 | 0 | 0 | 0 | 0 | 0 | 0 |

TABLE 5-continued

| Factor | wafer # → | | | | | | | | | | | | | | | | | |
|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 |
| 26 Co QT | 0 | 0 | 0 | 0 | 0 | 0 | 0 | 0 | 0 | 0 | 0 | 0 | 0 | 0 | 0 | 0 | 0 | 0 |
| 27 Co Thk | 0 | 0 | 0 | 0 | 0 | 0 | 0 | 0 | 0 | 0 | 0 | 0 | 0 | 0 | 0 | 0 | 0 | 0 |
| 28 s'cide RTA1 | 0 | 0 | 0 | 0 | 0 | 0 | 0 | 0 | 0 | 0 | 0 | 0 | 0 | 0 | 0 | 0 | 0 | 0 |
| 29 s'cide RTA2 | 0 | 0 | 0 | 0 | 0 | 0 | 0 | 0 | 0 | 0 | 0 | 0 | 0 | 0 | 0 | 0 | 0 | 0 |
| 30 LI Thk | 0 | 0 | 0 | 0 | 0 | 0 | 0 | 0 | 0 | 0 | 0 | 0 | 0 | 0 | 0 | 0 | 0 | 0 |
| 31 polishThk | 0 | 0 | 0 | 0 | 0 | 0 | 0 | 0 | 0 | 0 | 0 | 0 | 0 | 0 | 0 | 0 | 0 | 0 |
| 32 LI DICD | 0 | 0 | 0 | 0 | 0 | 0 | 0 | 0 | 0 | 0 | 0 | 0 | 0 | 0 | 0 | 0 | 0 | 0 |
| 33 LI alignX | 0 | 0 | 0 | 0 | 0 | 0 | 0 | 0 | 0 | 0 | 0 | 0 | 0 | 0 | 0 | 0 | 0 | 0 |
| 34 LI alignY | 0 | 0 | 0 | 0 | 0 | 0 | 0 | 0 | 0 | 0 | 0 | 0 | 0 | 0 | 0 | 0 | 0 | 0 |
| 35 LI o/e | 0 | 0 | 0 | 0 | 0 | 0 | 0 | 0 | 0 | 0 | 0 | 0 | 0 | 0 | 0 | 0 | 0 | 0 |
| 36 BMD DepThk | 0 | 0 | 0 | 0 | 0 | 0 | 0 | 0 | 0 | 0 | 0 | 0 | 0 | 0 | 0 | 0 | 0 | 0 |
| 37 BMD PCII | 0 | 0 | 0 | 0 | 0 | 0 | 0 | 0 | 0 | 0 | 0 | 0 | 0 | 0 | 0 | 0 | 0 | 0 |

TABLE 6

| Factor | wafer # → | | | | | | | | | | | | | | | | | |
|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 |
| 1 XterW | 0 | 0 | 0 | 0 | 0 | 0 | 0 | 0 | 0 | 0 | 0 | 0 | 0 | 0 | 0 | 0 | 0 | 0 |
| 2 I2 damage | 0 | 0 | 0 | 0 | 0 | 0 | 0 | 0 | 0 | 0 | 0 | 0 | 0 | 0 | 0 | 0 | 0 | 0 |
| 3 VNI | 0 | 0 | 0 | 0 | 0 | 0 | 0 | 0 | 0 | 0 | 0 | 0 | 0 | 0 | 0 | 0 | 0 | 0 |
| 4 VPI | 0 | −1 | −1 | −1 | −1 | −1 | −1 | −1 | −1 | −1 | −1 | −1 | −1 | −1 | −1 | −1 | −1 | 0 |
| 5 GatOx QT | 0 | −1 | −1 | 1 | 1 | −1 | −1 | 1 | 1 | −1 | −1 | 1 | 1 | −1 | −1 | 1 | 1 | 0 |
| 6 GateOx | 0 | −1 | −1 | −1 | −1 | −1 | −1 | −1 | −1 | −1 | −1 | −1 | −1 | −1 | −1 | −1 | −1 | 0 |
| 7 PolyThk | 0 | −1 | −1 | −1 | −1 | −1 | −1 | −1 | −1 | −1 | −1 | −1 | −1 | −1 | −1 | −1 | −1 | 0 |
| 8 G N2 I2 | 0 | −1 | −1 | −1 | −1 | 1 | 1 | 1 | 1 | −1 | −1 | −1 | −1 | 1 | 1 | 1 | 1 | 0 |
| 9 SiOn Dep | 0 | 0 | 0 | 0 | 0 | 0 | 0 | 0 | 0 | 0 | 0 | 0 | 0 | 0 | 0 | 0 | 0 | 0 |
| 10 G Mask QT | 0 | −1 | 1 | −1 | 1 | −1 | 1 | −1 | 1 | −1 | 1 | −1 | 1 | −1 | 1 | −1 | 1 | 0 |
| 11 G stp | 0 | 0 | 0 | 0 | 0 | 0 | 0 | 0 | 0 | 0 | 0 | 0 | 0 | 0 | 0 | 0 | 0 | 0 |
| 12 SiOn strip | 0 | 0 | 0 | 0 | 0 | 0 | 0 | 0 | 0 | 0 | 0 | 0 | 0 | 0 | 0 | 0 | 0 | 0 |
| 13 LDC n | 0 | 0 | 0 | 0 | 0 | 0 | 0 | 0 | 0 | 0 | 0 | 0 | 0 | 0 | 0 | 0 | 0 | 0 |
| 14 LDC p | 0 | 0 | 0 | 0 | 0 | 0 | 0 | 0 | 0 | 0 | 0 | 0 | 0 | 0 | 0 | 0 | 0 | 0 |
| 15 Iox | 0 | −1 | −1 | −1 | −1 | −1 | −1 | −1 | −1 | −1 | −1 | −1 | −1 | −1 | −1 | −1 | −1 | 0 |
| 16 LDD n | 0 | 0 | 0 | 0 | 0 | 0 | 0 | 0 | 0 | 0 | 0 | 0 | 0 | 0 | 0 | 0 | 0 | 0 |
| 17 LDD p | 0 | 0 | 0 | 0 | 0 | 0 | 0 | 0 | 0 | 0 | 0 | 0 | 0 | 0 | 0 | 0 | 0 | 0 |
| 18 UDOX1 | 0 | −1 | −1 | −1 | −1 | −1 | −1 | −1 | −1 | −1 | −1 | −1 | −1 | −1 | −1 | −1 | −1 | 0 |
| 19 spacer Thk | 0 | 0 | 0 | 0 | 0 | 0 | 0 | 0 | 0 | 0 | 0 | 0 | 0 | 0 | 0 | 0 | 0 | 0 |
| 20 spacer o/e | 0 | −1 | −1 | −1 | −1 | −1 | −1 | −1 | −1 | −1 | −1 | −1 | −1 | −1 | −1 | −1 | −1 | 0 |
| 21 spacerEtchEnt | 0 | −1 | −1 | −1 | −1 | −1 | −1 | −1 | −1 | −1 | −1 | −1 | −1 | −1 | −1 | −1 | −1 | 0 |
| 22 UDOX2 | 0 | −1 | −1 | −1 | −1 | −1 | −1 | −1 | −1 | −1 | −1 | −1 | −1 | −1 | −1 | −1 | −1 | 0 |
| 23 RpdepThk | 0 | −1 | −1 | −1 | −1 | −1 | −1 | −1 | −1 | −1 | −1 | −1 | −1 | −1 | −1 | −1 | −1 | 0 |
| 24 RTAsd | 0 | 0 | 0 | 0 | 0 | 0 | 0 | 0 | 0 | 0 | 0 | 0 | 0 | 0 | 0 | 0 | 0 | 0 |
| 25 RPE o/e | 0 | 0 | 0 | 0 | 0 | 0 | 0 | 0 | 0 | 0 | 0 | 0 | 0 | 0 | 0 | 0 | 0 | 0 |
| 26 Co QT | 0 | −1 | −1 | −1 | −1 | −1 | −1 | −1 | −1 | 1 | 1 | 1 | 1 | 1 | 1 | 1 | 1 | 0 |
| 27 Co Thk | 0 | 0 | 0 | 0 | 0 | 0 | 0 | 0 | 0 | 0 | 0 | 0 | 0 | 0 | 0 | 0 | 0 | 0 |
| 28 s'cide RTA1 | 0 | −1 | −1 | −1 | −1 | −1 | −1 | −1 | −1 | −1 | −1 | −1 | −1 | −1 | −1 | −1 | −1 | 0 |
| 29 s'cide RTA2 | 0 | −1 | −1 | −1 | −1 | −1 | −1 | −1 | −1 | −1 | −1 | −1 | −1 | −1 | −1 | −1 | −1 | 0 |
| 30 LI Thk | 0 | −1 | −1 | −1 | −1 | −1 | −1 | −1 | −1 | −1 | −1 | −1 | −1 | −1 | −1 | −1 | −1 | 0 |
| 31 polishThk | 0 | −1 | 1 | 1 | −1 | 1 | −1 | −1 | 1 | −1 | 1 | 1 | −1 | 1 | −1 | −1 | 1 | 0 |
| 32 LI DICD | 0 | 0 | 0 | 0 | 0 | 0 | 0 | 0 | 0 | 0 | 0 | 0 | 0 | 0 | 0 | 0 | 0 | 0 |
| 33 LI alignX | 0 | 0 | 0 | 0 | 0 | 0 | 0 | 0 | 0 | 0 | 0 | 0 | 0 | 0 | 0 | 0 | 0 | 0 |
| 34 LI alignY | 0 | 0 | 0 | 0 | 0 | 0 | 0 | 0 | 0 | 0 | 0 | 0 | 0 | 0 | 0 | 0 | 0 | 0 |
| 35 LI o/e | 0 | −1 | 1 | 1 | −1 | −1 | 1 | 1 | −1 | 1 | −1 | 1 | 1 | −1 | −1 | 1 | 0 | 0 |
| 36 BMD DepThk | 0 | 0 | 0 | 0 | 0 | 0 | 0 | 0 | 0 | 0 | 0 | 0 | 0 | 0 | 0 | 0 | 0 | 0 |
| 37 BMD PCII | 0 | −1 | −1 | −1 | −1 | −1 | −1 | −1 | −1 | −1 | −1 | −1 | −1 | −1 | −1 | −1 | −1 | 0 |

In summary, the described invention thus provides a method for a systematic approach to forming experimental designs for large, complex systems after an idea for a product is formed.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of designing experiments for acquiring processing experience in the design and manufacture of a product comprising:
   (a) determining critical variables for the product;
   (b) generating causal map-based coefficients for a matrix A as a function of the critical variables;

(c) setting a design matrix $U_k=0$ and $k=0$;

(d) generating a base design matrix X;

(e) evaluating $Y(P)=(I-B(B^TB)^{-1}B^T)[XP]//U]A$ according to Wynn's criterion, where P is a permutation matrix, I is an identity matrix, B is a blocking matrix, $B^T$ is a transposed matrix of B, A is a matrix composed of causal map-based coefficients, and Y(P) is a possible solution for the design matrix $U_k$;

(f) setting $k \leftarrow k+1$;

(g) running an algorithm to choose the best of random column permutations matrices P;

(h) running an algorithm to choose the best column permutation matrix P that is near a previous solution for the design matrix $U_k$; and (i) setting design matrix $U_k$ to solution comprising $XP^k$ with rows from $U_{k-1}$ appended; and (m) manufacturing prototype wafers using the experimental design matrix $U_k$.

2. The method of claim 1, further comprising:

(j) determining whether the design matrix $U_k$ is at desired size; and (k) if the design matrix $U_k$ is not at the desired size repeating steps (f) through (k) until step (j) indicates that the design matrix $U_k$ is at the desired size.

3. The method of claim 2, further comprising (l) setting the experimental design using the design matrix $U_k$ if step (j) indicates that the design matrix $U_k$ is at the desired size.

4. The method of claim 3 further comprising:

(n) determining model responses from the prototype wafers;

(o) determining whether the model responses are adequate; and (p) if the model responses are not adequate repeating steps (e) through (p) until step (o) indicates that the model responses are adequate.

5. The method of claim 4 further comprising:

(q) assess and propose manufacturing tolerances for the design matrix $U_k$;

(r) determine if the proposed manufacturing tolerances are manufacturable; and (s) if the manufacturing tolerances are not manufacturable repeating steps (a) through (r) until it is determined that the manufacturing tolerances are manufacturable.

6. The method of claim 5 further comprising (t) sending the design matrix $U_k$ to production if it is determined that the manufacturing tolerances are manufacturable.

7. The method of claim 6 wherein step (d) includes:

(d1) creating a causal network diagram using information determined in step (a);

(d2) creating an internode link-count distance matric using information from step (d1);

(d3) creating a causal map using information from step (d2);

(d4) identifying response nodes from the causal map created in step (d3); and (d5) calculating map-based coefficients from the information in the causal map.

8. A method of developing a semiconductor device comprising:

a development phase including;
evaluating a plurality of processing alternatives;
tuning a nominal process target for each of said plurality of processing alternatives;

a pre-production phase including;
acquiring process experience based upon said tuned nominal process targets comprising;
designing a plurality of experiments including;
determining a plurality of variables for a design of said semiconductor device and the manufacturing of said semiconductor device;
creating a causal network diagram for said determined plurality of critical factors;
transforming said causal network diagram into a causal map;
identifying responses from said causal map;
calculating map-based coefficients for a matrix A as a function of said causal map;
initializing an experimental design matrix $U_k$ wherein $k=0$;
selecting a base design matrix X;
running an optimal design algorithm to determine said design matrix $U_k$, wherein said running comprises:
defining $Y(P)=I-B(B^TB)^{-1}B^T)[XP//U]A$ according to Wynn's criterion, wherein P is a permutation, I is an identity matrix, B is a blocking matrix, $B^T$ is a transposed matrix of B, and Y(P) is a possible solution for said design matrix $U_k$;
running a first algorithm to choose the best of random column permutations matrices P; and
running a second algorithm to choose the best column permutation matrix P that is near a previous solution for said design matrix $U_k$; and
modeling responses of said plurality of experiments, wherein said plurality of experiments are designed using said design matrix $U_k$;
determining a tolerance window for each tuned nominal process target; and
a production phase including manufacturing a semiconductor device according to said process targets and said tolerance windows.

9. The method according to claim 8, wherein a critical variable comprises a response and a factor.

10. The method according to claim 8, wherein said creating said causal network diagram comprises:

rendering causal relationships wherein a response is the root node, major factors are spines branching of the response, factor groups as the primary branches, lower level factors branching off each spine or off other low level factors, the number of responses can be more than one, responses can point causally to other responses and each factor is represented as a single node;

and identifying critical variables that affect other factors.

11. The method according to claim 8, wherein transforming said causal network diagram into said causal map comprises:

creating an internode link-count distance matrix, wherein a distance between any pair of nodes of a causal network is a minimum number of links of a path connecting the pair of nodes, the corresponding matrix giving said distances between any pair of nodes is a natural input data structure for multidimensional scaling; and applying a multidimensional scaling algorithm.

12. The method according to claim 11, wherein said causal map includes information comprising:

a factor closer to a response node plausibly has a stronger effect;

two factors close together likely share an interaction;

responses sharing many factors cluster; and higher-level factors tend toward a center of said causal map.

13. The method according to claim 8, wherein said modeling response of said plurality of experiments comprises:
   manufacturing prototype wafers for said plurality of experiments according to said experimental design matrix $U_k$;
   generating response models by empirically measuring and mathematically modeling said prototype wafers; and
   determining if said response models are adequate.

14. The method according to claim 8, wherein determining a tolerance window comprises:
   proposing tolerances for each tuned nominal process target;
   assessing each proposed tolerance; and
   determining if the proposed tolerances can be manufactured.

* * * * *